United States Patent [19]

Hayafuji

[11] Patent Number: 4,559,102
[45] Date of Patent: Dec. 17, 1985

[54] METHOD FOR RECRYSTALLIZING A POLYCRYSTALLINE, AMORPHOUS OR SMALL GRAIN MATERIAL

[75] Inventor: Yoshinori Hayafuji, Tokyo, Japan

[73] Assignee: Sony Corporation, Tokyo, Japan

[21] Appl. No.: 493,025

[22] Filed: May 9, 1983

[51] Int. Cl.[4] ............................................. C30B 13/06
[52] U.S. Cl. ................................ 156/605; 156/617 R; 148/1.5; 427/43.1
[58] Field of Search ................. 156/617 R, DIG. 102, 156/606, 605; 148/1.5; 29/576 B; 427/43.1, 86; 250/492.3, 492.2; 219/121 EB; 357/23 TF

[56] References Cited

U.S. PATENT DOCUMENTS

| | | |
|---|---|---|
| 2,729,748 | 1/1956 | Robinson . |
| 3,144,552 | 8/1964 | Schonberg et al. . |
| 3,193,717 | 7/1965 | Nunan . |
| 3,614,423 | 10/1971 | Heynick et al. ............... 250/49.5 C |
| 3,702,412 | 11/1972 | Quintal ............................ 313/299 |
| 3,745,396 | 7/1973 | Quintal et al. .................... 313/37 |
| 3,769,600 | 10/1973 | Denholm ......................... 328/233 |
| 3,780,308 | 12/1973 | Nable ............................. 250/492 |
| 3,780,334 | 12/1973 | Leboutet ......................... 313/299 |
| 4,061,944 | 12/1977 | Gay ................................ 313/420 |
| 4,151,422 | 4/1979 | Goto ............................ 259/492 A |
| 4,184,896 | 1/1980 | Millea .......................... 250/492.2 |
| 4,229,502 | 10/1980 | Wu et al. ......................... 148/1.5 |
| 4,258,266 | 3/1981 | Robinson ..................... 290/492 A |
| 4,301,369 | 11/1981 | Matsuo et al. ................. 250/423 R |
| 4,341,569 | 7/1982 | Yaron et al. .................... 427/43.1 |
| 4,342,616 | 8/1982 | Elliot et al. ..................... 156/601 |
| 4,343,829 | 8/1982 | Tochikubo et al. ............. 427/43.1 |
| 4,361,762 | 11/1982 | Douglas ........................ 250/492.2 |
| 4,381,453 | 4/1983 | Cuomo et al. ................. 250/492.2 |
| 4,382,186 | 5/1983 | Denholm et al. .............. 250/492.2 |
| 4,414,242 | 11/1983 | Nishimura et al. ............ 427/43.1 |
| 4,448,632 | 5/1984 | Akasaka ................... 156/DIG. 102 |
| 4,453,086 | 6/1984 | Grobman ....................... 250/492.3 |

FOREIGN PATENT DOCUMENTS

| | | |
|---|---|---|
| 2146941 | 3/1972 | Fed. Rep. of Germany . |
| 2228294 | 12/1972 | Fed. Rep. of Germany . |
| 56-237 | 3/1981 | Japan ................................ 427/86 |
| 420395 | 9/1966 | Switzerland . |
| 1032071 | 6/1966 | United Kingdom . |

OTHER PUBLICATIONS

Shibata et al, Appl. Phys. Lett. 39(8) 10/81, pp. 645–647.

Primary Examiner—Hiram H. Bernstein
Attorney, Agent, or Firm—Lewis H. Eslinger; Alvin Sinderbrand

[57] ABSTRACT

For recrystallizing a layer of polysilicon extending over a layer of silicon dioxide on a substrate of silicon single crystal, the silicon dioxide layer is interrupted at seeding locations which are spaced apart in at least one direction and at which the polysilicon layer comes into contact with the substrate, a beam of charged particles is impacted and focused on the polysilicon layer, the substrate and beam are relatively displaced so that the beam of charged particles scans at least a portion of the polysilicon layer in the direction in which the seeding locations are spaced apart, the speed with which the beam relatively scans the polysilicon layer is determined so that the polysilicon layer is subjected to zone melting at the area of impact thereon for growing silicon single crystals by lateral epitaxial recrystallization of the polysilicon from the seeding locations, and charge buildup on the layer of silicon dioxide is avoided to prevent interference with focusing of the beam.

15 Claims, 7 Drawing Figures

METHOD FOR RECRYSTALLIZING A POLYCRYSTALLINE, AMORPHOUS OR SMALL GRAIN MATERIAL

BACKGROUND OF THE INVENTION

1. Field of the Invention

The present invention relates to the recrystallizing of polycrystalline or amorphous or small grain material to produce as large a grain size as possible, and more particularly is directed to improvements in growing a single crystal film by recrystallizing a polycrystalline or amorphous upper layer extending over an electrically isolating layer on a single crystal semiconductor substrate.

2. Description of the Prior Art

In growing a single crystal film from a polycrystalline or amorphous layer extending over an electrically isolating layer on a single crystal substrate, energy sources which emit beams of charged particles, such as, a spot electron beam or electron strip beam, can be used to scan and thereby melt the polycrystalline layer so as to induce liquid or solid phase regrowth by epitaxial recrystallization.

However, as the beam scans the polycrystalline or amorphous layer, some of the charged particles are able to travel therethrough and are absorbed by the electrically isolating layer on the substrate. In particular, a layer of charged particles is formed on that portion of the electrically isolating layer bordering the polycrystalline or amorphous layer. As a consequence thereof, as the beam subsequently scans the polycrystalline or amorphous layer, the layer of charged particles deflects the beam so that the latter cannot be adequately focused on the polycrystalline or amorphous layer for sufficiently melting the same.

OBJECTS AND SUMMARY OF THE INVENTION

Accordingly, it is an object of the present invention to provide a method of recrystallizing a polycrystalline or amorphous material extending over an electrically isolating layer on a single crystal semiconductor substrate which avoids the above described drawback in the prior art.

More specifically, an object of the present invention is to provide a new and improved method of recrystallizing a polycrystalline or amorphous material extending over an electrically isolating layer on a single crystal semiconductor substrate which uses a beam of charged particles issuing from an energy source and focused at the polycrystalline or amorphous material to melt the latter, and in which charge buildup on the electrically isolating layer is avoided to prevent interference with the focusing action.

In accordance with an aspect of this invention, a method of recrystallizing a polycrystalline or amorphous upper layer extending over an electrically isolating layer on a single crystal semiconductor substrate comprises interrupting said isolating layer at seeding locations which are spaced apart in one direction and at which said polycrystalline or amorphous upper layer comes into contact with said substrate, impacting on said upper layer a beam of charged particles which is focused at said upper layer, relatively displacing said substrate and beam in said one direction so that said beam scans at least a portion of said polycrystalline or amorphous upper layer, determining the speed with which said beam scans the upper layer so that the latter is subjected to zone melting when impacted by said beam for growing single crystals by lateral epitaxial recrystallization of said polycrystalline or amorphous upper layer from said seeding locations, and avoiding charge buildup on said isolating layer.

The avoidance of charge buildup in accordance with the invention can be achieved in one or more of several ways, which include providing the electrically isolating layer with a resistivity of less than $10^{13}$ ohms-cm, doping said polycrystalline or amorphous layer, for example, with phosphorous, boron or arsenic, and providing on the upper layer a member of electrically conductive material which may be in the form of a mesh pervious to said beam of charged particles and which is electrically connected to earth potential in a suitable path which may extend through the substrate.

The above, and other objects, features and advantages of this invention will become apparent from the following detailed description which is to be read in conjunction with the accompanying drawings. Cross reference is made to another co-pending application Ser. No. 492,800 filed May 9, 1983 by the inventor hereof and assigned to the same assignee.

DETAILED DESCRIPTION OF PREFERRED EMBODIMENTS

Before proceeding with the detailed description of the present invention and in order to provide a clearer understanding of the same, it is to be understood that the notation [x,y,z] will be used hereinafter to describe "direction" in terms of coordinates x, y, and z, with a bar over a coordinate, such as $\bar{x}$, denoting a negative direction. Thus, for example, [100] denotes a direction of one positive unit along the x axis, [0$\bar{1}$0] denotes a direction of one negative unit along the y axis and [001] denotes a direction of one positive unit along the z axis. It is also to be understood that the orientation of a planar surface is defined in terms of the normal thereto and is denoted by the notation {x,y,z}. Thus, a planar surface in the x-y plane has an orientation along the z axis, that is, for example, a {001} orientation.

The provision of a thin, single-crystal silicon film on an insulating layer, commonly referred to as a silicon-on-insulator or SOI, has become quite important in the formation of multiple active layers in silicon integrated circuitry. For providing such a thin single-crystal film on an insulating layer, there is initially provided a layered structure 10 (FIG. 2) including a polycrystalline or amorphous upper layer 11 suitably deposited over an electrically isolating layer 12 on a single crystal semiconductor substrate 13. Upper layer 11 may be formed of, but is not limited to polycrystalline materials, such as, silicon, germanium, 3–5 compound semiconductors, silicon carbide, germanium arsenic, and germanium phosphate. Electrically isolating layer 12 typically is silicon dioxide but can be any other suitable electrically isolating material. Substrate 13 may be of single crystal silicon, diamond, sapphire or any other suitable single crystalline structure.

Figure 2:
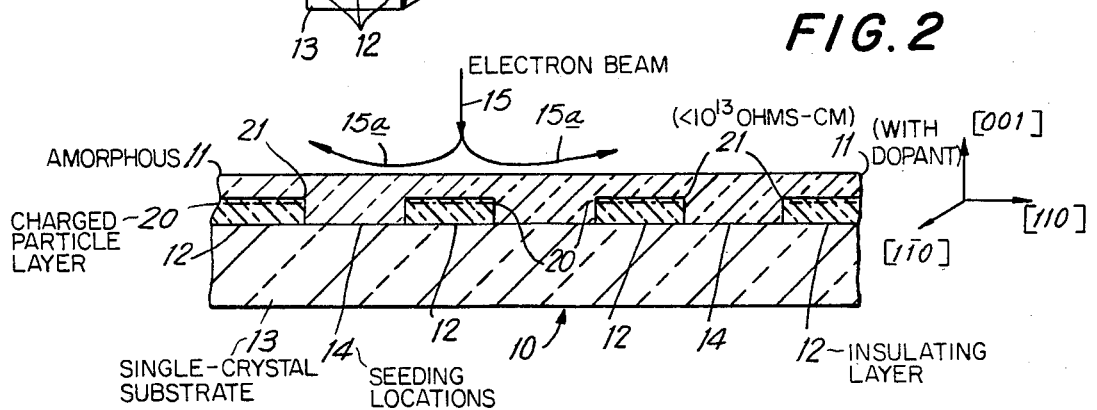
FIG. 2 is a sectional view of a layered structure including an upper layer of polycrystalline or amorphous material extending over an electrically isolating layer on a single semiconductor substrate and which can be impacted by a beam from the apparatus of FIG. 1.

As shown particularly in FIG. 2, in the layered structure 10 to be used in accordance with this invention, electrically isolating layer 12 is interrupted at seeding locations 14 so as to form islands which are spaced apart in one direction, such as along a [110] direction. Thus, polycrystalline or amorphous upper layer 11 contacts substrate 13 at seeding locations 14.

Figure 1:
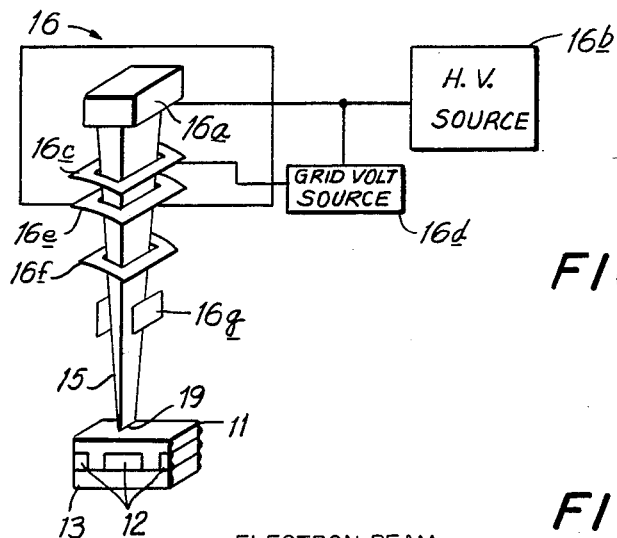
FIG. 1 is a schematic diagram of an apparatus for generating a beam of charged particles and which can be used for recrystallizing a polycrystalline or amorphous material in accordance with an embodiment of the present invention.

Upper layer 11 is melted by a beam of charged particles 15 which is focused at layer 11 and which is scanned or moved relative to structure 10 so as to travel, for example, in a [110] direction, which is the direction in which seeding locations 14 are spaced apart. Beam 15 is supplied from any suitable charged particle source 16 which is shown in FIG. 1 to produce a strip electron beam 15. Such strip electron beam 15 may be formed by extractions of electrons from a uniformly emitting strip-like thermionic cathode 16a of high aspect ratio, with the length of the strip-like cathode being made comparable to the width of the area to be processed, that is the treated target area, and with the narrow cathode dimension being chosen to be compatible with long-term, uniform cathode emission and the desired compression of electron beam 15. A suitable high voltage source 16b is connected to cathode 16a so as to heat the latter. An extraction grid 16c connected to a grid control voltage source 16d, is spaced a few millimeters from cathode 16c, with a perveance such that the required current density can be obtained with a few kilovolts or less of an extraction pulse. A narrow strip electron beam is injected at an aperture 16e in a main electrostatic accelerating gap. The geometry of aperture 16e is such that the electric field further focuses the strip laterally during the initial stages of acceleration in the electrostatic accelerating main gap. Electron beam 15 is then directed through ground aperture 16f to impact upon upper layer 11 at a line 19. Displacement of electron beam 15 relative to substrate 13 for causing impact line 19 to scan upper layer 11 may be effected by a deflection system including electrostatic plates 16g which are suitably energized to cause deflection of electron beam 15 at right angles to the length of the strip-like cross-section of the beam. Alternatively, scanning of the surface of upper layer 11 by impact line 19 can be achieved by maintaining beam 15 stationary and suitably moving structure 10 relative thereto. Impact line 19 may be made to travel relative to structure 10 in a [110] direction, which is the direction in which seeding locations 14 are spaced apart. Thus, in melting an area or zone of upper layer 11, hereinafter referred to as zone melting, at a beam impact area, such as at impact line 19, for growing single crystals by lateral epitaxial recrystallization of upper layer 11 from seeding locations 14, an electron beam is displaced relative to substrate 13 along, for example, the [110] direction so that the beam impact area scans at least a portion of upper layer 11.

Referring once again to FIG. 2, it will be seen that, when zone melting is effected by impacting beam 15 on upper layer 11, a layer of charged particles 20, such as electrons, may be formed on an upper portion 21 of each island of electrically isolating layer 12 bordering upper layer 11 as beam 15 scans the latter. More specifically, as beam 15 scans upper layer 11, some of the charged particles from beam 15 travel through upper layer 11 and are captured by electrically isolating layer 12. Consequently, a charge is built-up on layer 12 and, as beam 15 continues its scanning of upper layer 11, the layer of charged particles 20 deflects the particles or electrons of beam 15 away from upper layer 11, as at 15a, so that focusing of beam 15 is interfered with and the efficient zone melting of layer 11 is deteriorated.

In order to substantially avoid such an undesirable consequence, one or more of the following measures may be adopted for preventing charge buildup according to this invention.

In accordance with a first embodiment of this invention, a material having a resistivity of less than $10^{13}$ ohms-cm is used as the electrically isolating layer 12 of structure 10. As will be readily appreciated, the lower the resistivity of the islands of layer 12, the less likely it is that charged particles 20 will remain on portions 21 of such islands bordering upper layer 11. More particularly, at a resistivity of less than $10^{13}$ ohms-cm, charged particles 20 are able to move sufficiently about the electrically isolating layer so as to avoid build-up near layer 11. A suitable material which can be used as electrically isolating layer 12 for promoting such movement is polycrystalline or amorphous silicon having a resistivity of about $10^7$ ohms-cm. Such resistivity of polycrystalline or amorphous silicon can be achieved by doping the same with oxygen.

Assuming the charged particles are negatively charged, charge build-up can be avoided in accordance with another embodiment of this invention by doping upper layer 11 with an impurity, such as phosphorus, boron, arsenic or the like. Such dopants enable upper layer 11 to capture more of the negatively charged particles and therefore substantially reduce the number of charged particles which pass therethrough to form charged particle layer 20. Consequently, deflection of beam 15 by the charge build-up or layer 20 is at least substantially reduced.

Figure 3:
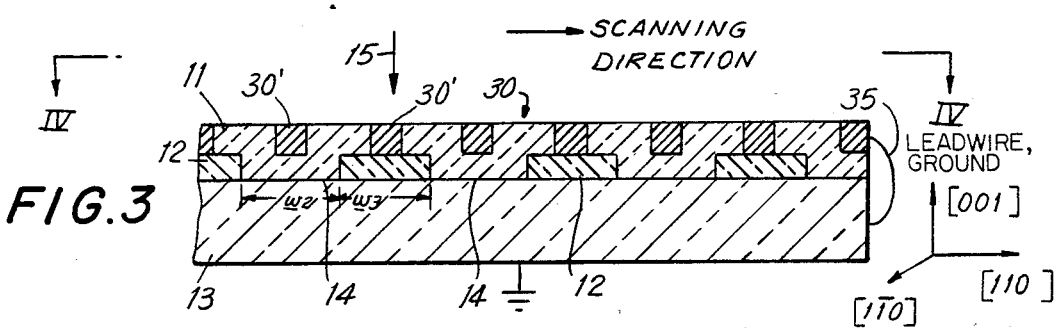
FIG. 3 is a sectional view similar to that of FIG. 1, but illustrating an embodiment of the invention.
Figure 4:
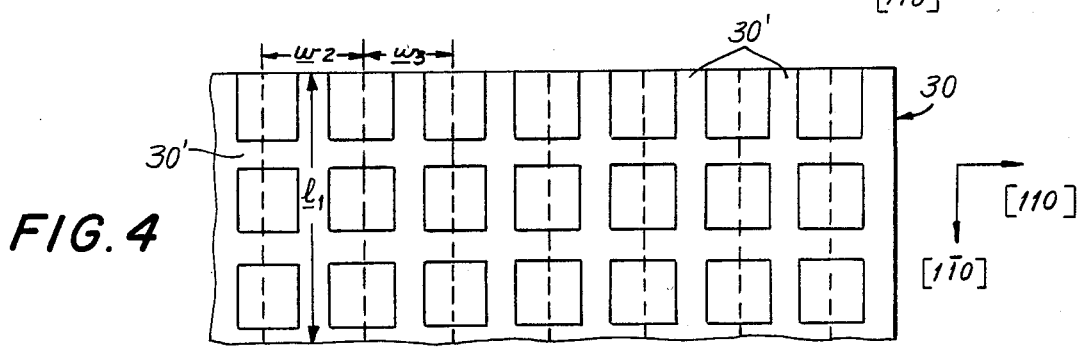
FIG. 4 is a top plan view of the structure shown on FIG. 3.

Referring now to FIG. 3, it will be seen that avoidance of the charge buildup in accordance with another embodiment of the invention is achieved by contacting upper layer 11 with a member 30 of electrically conductive material which is pervious to beam 15 and which is electrically connected to earth potential. As particularly shown in FIG. 4, member 30 may be in the form of a mesh or grid comprised of elements 30' which are interconnected to each other. As shown on FIG. 3, mesh or member 30 may be substantially incorporated or diffused within upper layer 11 and connected to substrate 13, for example, by a lead wire 35. Substrate 13 is also shown to be connected to ground, that is, to earth potential. Alternatively, member 30 can be directly connected to ground rather than through substrate 13. As beam 15 scans upper layer 11 to melt the latter, any charge that would build-up at portions 21 of layer 12 is drawn off to ground through the relatively low-resistance path that includes member 30, conductor 35 and substrate 13. Thus, charge buildup on the islands of electrically isolating layer 12 which would interfere with focusing of beam 15 is avoided.

Figure 5:
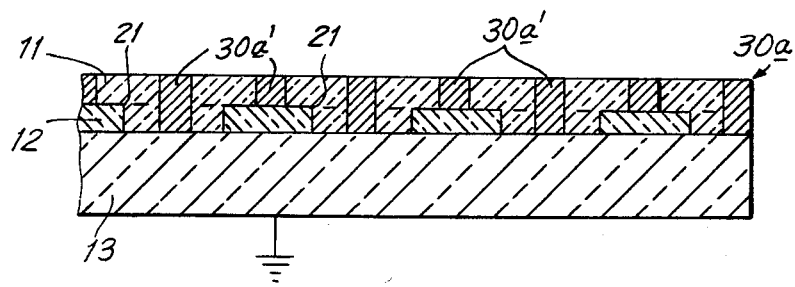
FIGS. 5–7 are sectional views similar to that of FIG. 3, but illustrating other embodiments of this invention.

FIG. 5 illustrates another grid-like embodiment of the present invention wherein a member 30a of electrically conducting material is made up of orthogonally related elements 30a' incorporated in upper layer 11 and at least some of which extend into direct contact with substrate 13. Consequently, with substrate 13 being grounded, no lead wire is required between member 30a and substrate 13 in order to provide an electrical path from member 30a to ground for avoiding charge buildup at portions 21 of electrically isolating layer 12. Any of these grid-like members 30 or 30a formed of electrically conductive material incorporated within at least upper layer 11, can be formed by doped semiconductor regions in layer 11 and/or by suitably inserting therein patterns of refractory metals or silicides.

Figure 6:
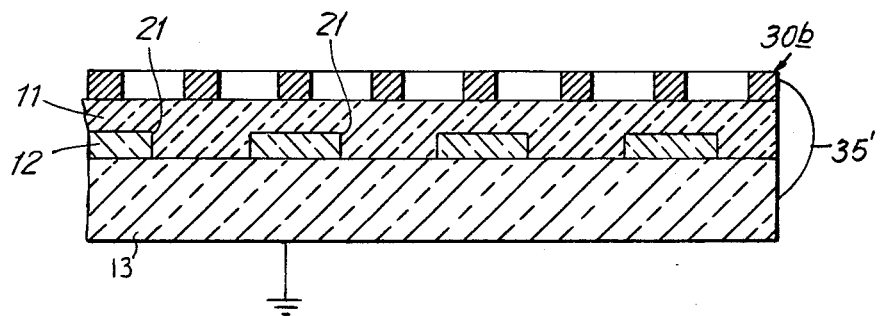

In another embodiment shown in FIG. 6, a grid-like member 30b is formed on the surface of upper layer 11. Member 30b is also connected to earth potential either directly, or by conductor 35' through substrate 13. Grid-like member 30b operates to avoid charge buildup by providing a path to earth potential for charged particles that may tend to collect at portions 21 of layer 12.

Figure 7:
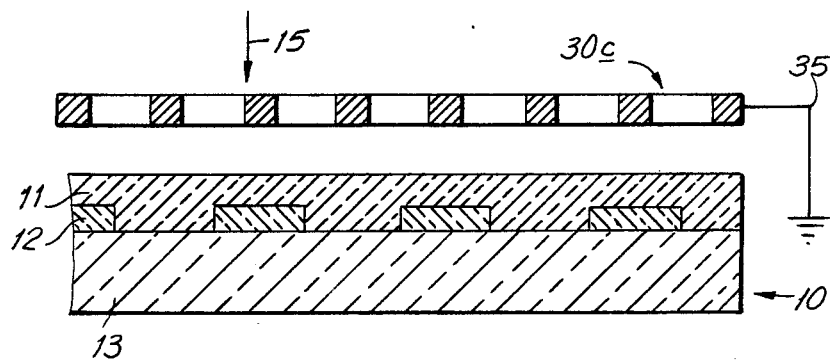

In still another embodiment shown on FIG. 7, a grid-like member 30c is in the form of a removable mask effective for avoidance of charge buildup. More particularly, grid-like member 30c is placed in contact with upper layer 11 while beam 15 is directed therethrough to scan upper layer 11. After such scanning is completed, member 30c is removed from contact with upper layer 11. Thus, member 30c can be incorporated as part of an apparatus according to this invention for recrystallizing an amorphous or polycrystalline layer.

As earlier noted, any of the grid-like members 30, 30a, 30b or 30c may be formed of, but are not limited to, refractory metals and silicides. If such members of conductive material adversely react chemically with upper layer 11 when placed in contact therewith, a barrier layer may be interposed therebetween. A suitable material for such barrier layer is $Si_3N_4$ having a thickness of less than 100 angstroms.

The speed $v_s$ at which electron beam 15 should relatively scan upper layer 11 in order to achieve so-called "zone melting" can be determined from the following:

$$v_s = \omega_1/\tau \quad (1)$$

in which $\omega_1$ is the width of the beam impact area 19 (FIG. 1) on layer 11, and $\tau$ is the time required for upper layer 11 to return from a liquid state to a solid state after it has been melted by beam 15. Such "zone melting" is necessary for promoting lateral epitaxial growth of single crystal.

It will be apparent from equation (1) that the scanning speed $v_s$ for zone melting is inversely proportional to $\tau$. In general, it is desirable to use as high a scanning speed as possible consistent with zone melting and, therefore, a low value of $\tau$ is desired. The value of $\tau$ is dependent on many factors, such as, the thicknesses of layers 11 and 12, the temperature at which the upper layer 11 melts, and the pressure of the atmosphere in which the zone melting is effected.

A typical example of making an SOI in accordance with an embodiment of the present invention is as follows: On substrate 13, comprised of a single crystal silicon wafer of a {001} orientation having a resistance per centimeter of 8–12 ohms, a diameter of 75 millimeters and a thickness of approximately 380 microns, a film of $SiO_2$ having about a 0.5 micron thickness is thermally grown after two hours at approximately 1,000° C. The $SiO_2$ film is photolithographically etched away so as to form seeding areas 14 therein each having a width $\omega_2$ of 30 to 100 microns and separating $SiO_2$ islands each having a width $\omega_3$ of 30 to 100 microns and a length $l_1$ of 2 centimeters. The long sides of the $SiO_2$ islands are substantially parallel to the [1$\bar{1}$0] direction and the short sides thereof are substantially parallel to the [110] direction. A polysilicon film having a thickness of about 0.5 microns is then deposited over the entire upper surface of the substrate wafer with the etched $SiO_2$ or electrically isolating layer thereon by means of chemical vapor deposition using a mixture of $SiH_4$ and $N_2$ at 650° C. so as to form upper layer 11. The resulting structure 10 of polysilicon, $SiO_2$ and silicon is disposed in a receptable which is vacuum-pumped to a pressure of less than $2 \times 10^{-7}$ Torrs. Removable mask 30c is placed in contact with upper layer 11. Electron beam 15 is then focused on a narrow strip of upper layer 11 which is approximately 60 microns wide and 3 centimeters long. Electron beam 15a has an average energy density of 0.7 mw/cm² at approximately 10 kv and at a target current of about 1.0 to 1.3 amperes. Finally, the structure 10 is irradiated for 0.1 to 2 milliseconds while being relatively displaced in direction [110] with respect to electron beam 15 at a speed of up to 500 cm/sec. Once irradiation is complete, mask 30c is removed from structure 10.

It will be appreciated from the foregoing, that the present invention provides a new and improved method of recrystallizing a polycrystalline or amorphous material extending over an electrically isolating layer on a single crystal semiconductor substrate. In particular, the present invention provides a method for avoiding charge buildup on that portion of an electrically isolated layer bordering the polycrystalline or amorphous material so as to prevent interference with focusing of beam 15.

Having specifically described illustrative embodiments of the invention with reference to the accompanying drawings, it is to be understood that the invention is not limited to those precise embodiments and that various changes and modifications may be effected therein by one skilled in the art without departing from the scope and spirit of the invention as defined in the appended claims.

I claim:

1. A method of recrystallizing a polycrystalline or amorphous upper layer extending over an electrically isolating layer on a single crystal semiconductor substrate in which said isolating layer is interrupted at seeding locations which are spaced apart in one direction and at which said polycrystalline or amorphous upper layer comes into contact with said substrate, the method comprising:

impacting on said upper layer a beam of charged particles which is focused at said upper layer;

relatively displacing said substrate and beam in said one direction so that said beam scans at least a portion of said polycrystalline or amorphous upper layer;

determining the speed with which said beam scans the upper layer so that the latter is subjected to zone melting when impacted by said beam for growing single crystals by lateral epitaxial recrystallization of said polycrystalline or amorphous upper layer from said seeding locations; and avoding charge buildup on said isolating layer by providing said electrically isolating layer with a resistivity of less than $10^{13}$ ohms-cm.

2. A method of recrystallizing a polycrystalline or amorphous upper layer as in claim 1; wherein the step of avoiding charge buildup includes the further steps of connecting said substrate to earth potential and connecting said member of electrically conductive material to said substrate.

3. A method of recrystallizing a polycrystalline or amorphous upper layer as in claim 1; wherein, for said avoiding of charge buildup, said electrically isolating layer is polycrystalline or amorphous silicon having a resistivity of about $10^7$ ohms-cm.

4. A method of recrystallizing a polycrystalline or amorphous upper layer as in claim 3; wherein said electrically isolating layer or polycrystalline or amorphous silicon is doped with oxygen.

5. A method of recrystallizing a polycrystalline or amorphous upper layer as in claim 1; wherein charge buildup on said isolating layer is substantially caused by negatively charged particles and said step of avoiding charge buildup includes the further step of doping said upper layer with an impurity.

6. A method of recrystallizing a polycrystalline or amorphous upper layer as in claim 5; wherein said impurity is selected from the group consisting of phosphorus, boron and arsenic.

7. A method of recrystallizing a polycrystalline or amorphous upper layer as in claim 1; wherein said electrically isolating layer is $SiO_2$.

8. A method of recrystallizing a polycrystalline or amorphous upper layer as in claim 1; wherein the step of avoiding charge buildup includes the further step of placing in contact with said upper layer a member of electrically conductive material which is pervious to said beam of charged particles and which is electrically connected to earth potential.

9. A method of recrystallizing a polycrystalline or amorphous upper layer as in claim 8; wherein said member of electrically conductive material is connected to said earth potential through said upper layer and said substrate.

10. A method of recrystallizing a polycrystalline or amorphous upper layer as in claim 9; wherein said member of electrically conductive material is incorporated in said upper layer.

11. A method of recrystallizing a polycrystalline or amorphous upper layer as in claim 10; wherein said member of electrically conductive material is a doped semiconductor.

12. A method of recrystallizing a polycrystalline or amorphous upper layer as in claim 8; wherein said member of electrically conductive material is in the form of a removable mask placed over, and in contact with said upper layer.

13. A method of recrystallizing a polycrystalline or amorphous upper layer as in claim 8; wherein said electrically conductive material is selected from the group consisting of refractory metals and silicides.

14. A method of recrystallizing a polycrystalline or amorphous upper layer extending over an electrically isolating layer on a single crystal semiconductor substrate in which said isolating layer is interrupted at seeding locations which are spaced apart in one direction and at which said polycrystalline or amorphous upper layer comes into contact with said substrate, the method comprising:

impacting on said upper layer a beam of charged particles that is focused at said upper layer;

relatively displacing said substrate and beam in said one direction so that said beam scans at least a portion of said polycrystalline or amorphous upper layer;

determining the speed with which said beam scans the upper layer so that the latter is subjected to zone melting when impacted by said beam for growing single crystals by lateral epitaxial recrystallization of said polycrystalline or amorphous upper layer from said seeding locations; and avoiding charge buildup on said isolating layer by placing adjacent said upper layer a member of electrically conductive material that is pervious to said beam of charged particles and electrically connected to earth potential and by providing a layer of $Si_3N_4$ between said member of electrically conductive material and said upper layer.

15. A method of recrystallizing a polycrystalline or amorphous upper layer as in claim 14; wherein said layer of $Si_3N_4$ has a thickness of less than 100 angstroms.

* * * * *